US012696499B2

(12) United States Patent
Chen et al.

(10) Patent No.: US 12,696,499 B2
(45) Date of Patent: Jul. 28, 2026

(54) SEMICONDUCTOR DEVICE AND MANUFACTURING METHOD THEREOF

(71) Applicant: UNITED MICROELECTRONICS CORP., Hsin-Chu City (TW)

(72) Inventors: Hsin-Yu Chen, Nantou County (TW); Chun-Hao Lin, Kaohsiung City (TW); Yuan-Ting Chuang, Yilan County (TW); Shou-Wei Hsieh, Hsinchu City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 373 days.

(21) Appl. No.: 18/373,953

(22) Filed: Sep. 27, 2023

(65) Prior Publication Data

US 2025/0063776 A1 Feb. 20, 2025

(30) Foreign Application Priority Data

Aug. 14, 2023 (TW) ................................. 112130479

(51) Int. Cl.
| | |
|---|---|
| *H10D 62/10* | (2025.01) |
| *H10D 30/01* | (2025.01) |
| *H10D 30/62* | (2025.01) |
| *H10D 84/01* | (2026.01) |

(Continued)

(52) U.S. Cl.
CPC ......... *H10D 62/115* (2025.01); *H10D 30/024* (2025.01); *H10D 30/62* (2025.01); *H10D 30/6219* (2025.01); *H10D 84/0126* (2025.01); *H10D 84/0128* (2025.01); *H10D 84/0151* (2025.01); *H10D 84/0158* (2025.01); *H10D*

*84/813* (2025.01); *H10D 84/8311* (2025.01); *H10D 84/834* (2025.01)

(58) Field of Classification Search
CPC ............. H10D 84/128; H10D 84/0151; H10D 84/0188; H10D 84/856; H10D 84/834; H10D 84/813; H01L 21/76229; H01L 21/76232
See application file for complete search history.

(56) References Cited

U.S. PATENT DOCUMENTS

| | | | |
|---|---|---|---|
| 7,425,740 B2 | 9/2008 | Liu | |
| 2009/0090976 A1* | 4/2009 | Kavalieros ........... | H10D 84/038 |
| | | | 257/E29.264 |
| 2021/0288048 A1* | 9/2021 | Chuang .............. | H10D 84/0144 |

* cited by examiner

*Primary Examiner* — Alia Sabur
(74) *Attorney, Agent, or Firm* — Winston Hsu

(57) ABSTRACT

A semiconductor device includes a semiconductor substrate, an isolation structure, and a first electrically conductive structure. The semiconductor substrate has a planar device region and a fin device region. The semiconductor substrate includes a mesa structure disposed in the planar device region and fin-shaped structures disposed in the fin device region. The isolation structure is disposed on the semiconductor substrate and includes a first portion which is disposed on the planar device region and covers a sidewall of the mesa structure, and the isolation structure further includes a second portion which is disposed on the fin device region and located between the fin-shaped structures. The first electrically conductive structure is disposed on the planar device region. The first electrically conductive structure is partly disposed above the mesa structure in a vertical direction and partly disposed above the first portion of the isolation structure in the vertical direction.

20 Claims, 9 Drawing Sheets

(51) Int. Cl.
    *H10D 84/80*         (2025.01)
    *H10D 84/83*         (2025.01)

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more particularly, to a semiconductor device including a planar device region and a fin device region and a manufacturing method thereof.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly. Transistors are important semiconductor devices in the integrated circuits. In recent years, there is a development for three-dimensional or non-planar field effect transistors (FETs) such as fin field effect transistors (Fin-FETs) for replacing the planar FETs. However, the structures and characteristics of other devices will be influenced by the manufacturing method of the fin device, and people in related fields are still working hard to improve the integration between the manufacturing method of the fin device and the manufacturing method of other devices for meeting the product specifications.

SUMMARY OF THE INVENTION

A semiconductor device and a manufacturing method thereof are provided in the present invention. An isolation structure covers a sidewall of a mesa structure and an electrically conductive structure extends to be located above the isolation structure for improving the electrical performance of a planar device and meeting product specifications.

According to an embodiment of the present invention, a semiconductor device is provided. The semiconductor device includes a semiconductor substrate, an isolation structure, and a first electrically conductive structure. The semiconductor substrate has a planar device region and a fin device region, and the semiconductor substrate includes a mesa structure and fin-shaped structures. The mesa structure is disposed in the planar device region, and the fin-shaped structures are disposed in the fin device region. The isolation structure is disposed on the semiconductor substrate, and the isolation structure includes a first portion and a second portion. The first portion is disposed on the planar device region and covers a sidewall of the mesa structure, and the second portion is disposed on the fin device region and located between the fin-shaped structures. The first electrically conductive structure is disposed on the planar device region, and the first electrically conductive structure is partly disposed above the mesa structure in a vertical direction and partly disposed above the first portion of the isolation structure in the vertical direction.

In some embodiments, the semiconductor substrate further includes a base layer. The mesa structure and each of the fin-shaped structures protrude upwards from a top surface of the base layer, and a width of the mesa structure is greater than a width of each of the fin-shaped structures.

In some embodiments, a top surface of the first portion of the isolation structure is higher than a top surface of the second portion of the isolation structure in the vertical direction.

In some embodiments, a top surface of the first portion of the isolation structure is higher than or coplanar with a top surface of the mesa structure in the vertical direction.

In some embodiments, the first portion of the isolation structure includes a first section and a second section. The second section is connected with the first section, the first section is located between the sidewall of the mesa structure and the second section, and a top surface of the first section is higher than a top surface of the second section in the vertical direction.

In some embodiments, a sidewall of a topmost portion of the mesa structure is covered by the first portion of the isolation structure.

In some embodiments, the first portion of the isolation structure directly contacts a sidewall of a topmost portion of the mesa structure.

In some embodiments, a bottom surface of the first electrically conductive structure disposed above the first portion of the isolation structure is higher than a top surface of the mesa structure in the vertical direction.

In some embodiments, the semiconductor device further includes a second electrically conductive structure disposed on the fin device region. The second electrically conductive structure is disposed on the second portion of the isolation structure and disposed straddling the fin-shaped structures.

In some embodiments, the first electrically conductive structure is connected with the second electrically conductive structure.

According to an embodiment of the present invention, a manufacturing method of a semiconductor device is provided. The manufacturing method includes the following steps. A semiconductor substrate is provided. The semiconductor substrate has a planar device region and a fin device region, and the semiconductor substrate includes a mesa structure and fin-shaped structures. The mesa structure is disposed in the planar device region, and the fin-shaped structures are disposed in the fin device region. An isolation structure is formed on the semiconductor substrate, and the isolation structure includes a first portion and a second portion. The first portion is disposed on the planar device region and covers a sidewall of the mesa structure, and the second portion is disposed on the fin device region and located between the fin-shaped structures. A first electrically conductive structure is formed on the planar device region. The first electrically conductive structure is partly disposed above the mesa structure in a vertical direction and partly disposed above the first portion of the isolation structure in the vertical direction.

In some embodiments, a method of forming the isolation structure includes forming an insulation material on the semiconductor substrate, wherein a first portion of the insulation material is formed on the planar device region and covers the sidewall of the mesa structure, and a second portion of the insulation material is formed on the fin device region and located between the fin-shaped structures; and performing an etching process to the insulation material for removing a part of the second portion of the insulation material and exposing a top portion of each of the fin-shaped structures, wherein a mask layer covers the mesa structure and at least a part of the first portion of the insulation material in the etching process, and a part of the first portion of the insulation material is removed by the etching process.

In some embodiments, a top surface of the second portion of the insulation material is lower than a top surface of each of the fin-shaped structures in the vertical direction after the etching process.

In some embodiments, a sidewall of a topmost portion of the mesa structure is covered by the first portion of the insulation material after the etching process.

In some embodiments, the second portion of the insulation material is partially removed by the etching process to become the second portion of the isolation structure.

In some embodiments, the method of forming the isolation structure further includes performing a removing process after the etching process, wherein the mask layer is removed before the removing process, and the first portion of the insulation material is partially removed by the etching process and the removing process to become the first portion of the isolation structure.

In some embodiments, the first portion of the isolation structure includes a first section and a second section. The second section is connected with the first section, the first section is located between the sidewall of the mesa structure and the second section, and a top surface of the first section is higher than a top surface of the second section in the vertical direction.

In some embodiments, a sidewall of a topmost portion of the mesa structure is covered by the first section of the first portion of the isolation structure after the removing process.

In some embodiments, the manufacturing method further includes forming a second electrically conductive structure on the fin device region, wherein the second electrically conductive structure is disposed on the second portion of the isolation structure and disposed straddling the fin-shaped structures.

In some embodiments, the first electrically conductive structure and the second electrically conductive structure are formed concurrently by the same process and connected with each other.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-6 are schematic drawings illustrating a manufacturing method of a semiconductor device according to an embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, and FIG. 6 is a schematic drawing in a step subsequent to FIG. 5.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
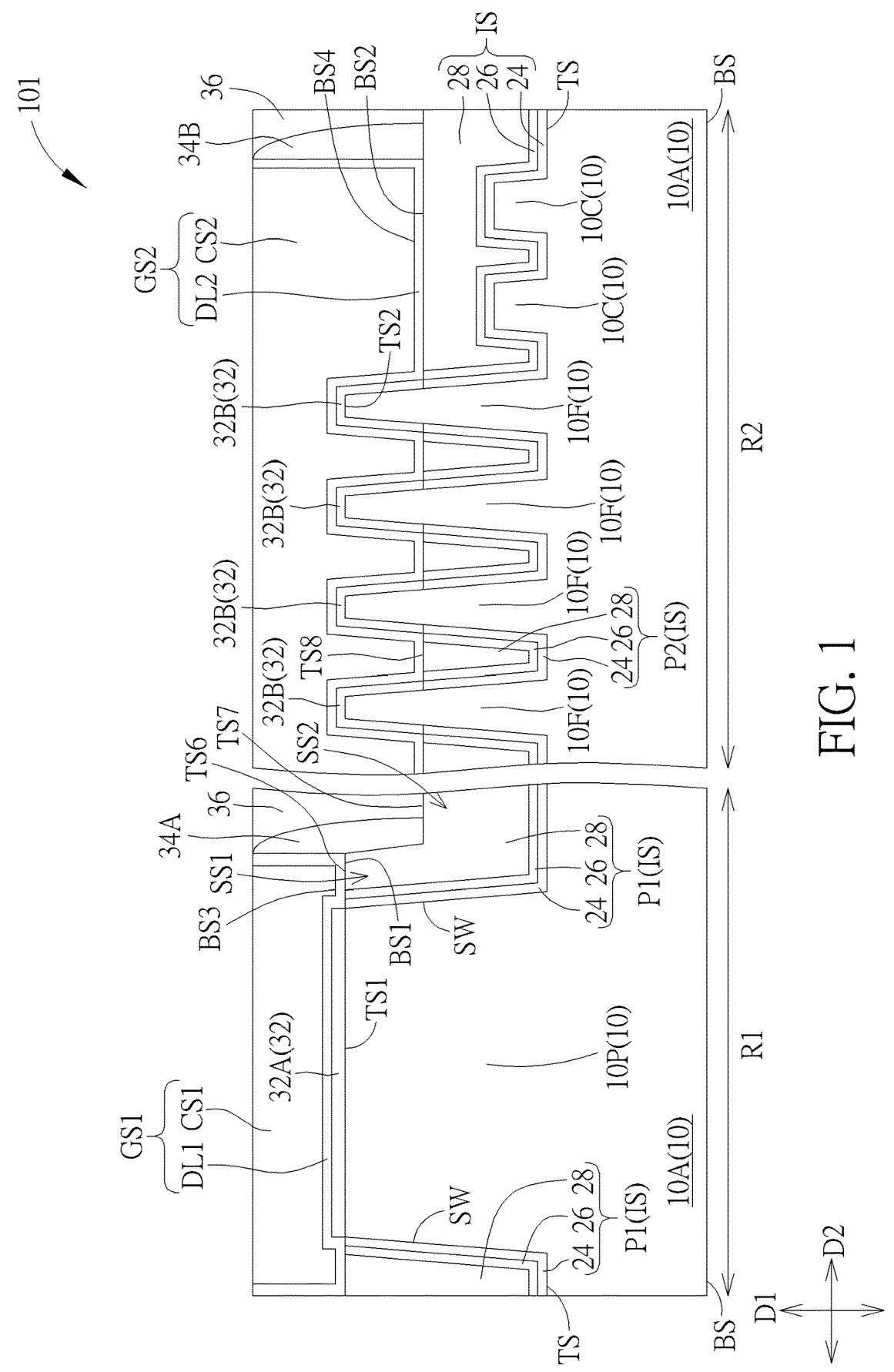
FIG. 1 is a schematic drawing illustrating a semiconductor device according to a first embodiment of the present invention.

Please refer to FIG. 1. FIG. 1 is a schematic drawing illustrating a semiconductor device 101 according to a first embodiment of the present invention. As shown in FIG. 1, the semiconductor device 101 includes a semiconductor substrate 10, an isolation structure IS, and a first electrically conductive structure CS1. The semiconductor substrate 10 has a planar device region R1 and a fin device region R2, and the semiconductor substrate 10 includes a mesa structure 10P and fin-shaped structures 10F. The mesa structure 10P is disposed in the planar device region R1, and the fin-shaped structures 10F are disposed in the fin device region R2. The isolation structure IS is disposed on the semiconductor substrate 10, and the isolation structure IS includes a first portion P1 and a second portion P2. The first portion P1 is disposed on the planar device region R1 and covers a sidewall SW of the mesa structure 10P, and the second portion P2 is disposed on the fin device region R2 and located between the fin-shaped structures 10F. The first electrically conductive structure CS1 is disposed on the planar device region R1, and the first electrically conductive structure CS1 is partly disposed above the mesa structure 10P in a vertical direction D1 and partly disposed above the first portion P1 of the isolation structure IS in the vertical direction D1. The first portion P1 of the isolation structure IS covering the sidewall SW of the mesa structure 10P and the first electrically conductive structure CS1 extending to be located above the first portion P1 of the isolation structure IS may be used to improve an electrical performance of a planar device corresponding to the first electrically conductive structure CS1, such as improving a capacitance stability of a planar metal-oxide-semiconductor capacitor (MOSCAP) for meeting related product specifications, but not limited thereto.

In some embodiments, the semiconductor substrate 10 may include a silicon substrate, an epitaxial silicon substrate, a silicon germanium substrate, a silicon carbide substrate, a silicon-on-insulator (SOI) substrate, or a substrate made of other suitable semiconductor materials. The planar device region R1 and the fin device region R2 described above may be defined in the semiconductor substrate 10, and the planar device region R1 and the fin device region R2 may be separated from each other or be disposed adjacent to each other according to some design considerations. In addition, the semiconductor substrate 10 may further include a base layer 10A, and the base layer 10A may be partly located in the planar device region R1 and partly located in the fin device region R2. The mesa structure 10P may protrude upwards in the vertical direction D1 from a top surface TS of the base layer 10A located in the planar device region R1, and each of the fin-shaped structures 10F may protrude upwards in the vertical direction D1 from the top surface TS of the base layer 10A located in the fin device region R2. A material composition of at least a portion (such as the top portion) of the base layer 10A may be identical to or similar to a material composition of the mesa structure 10P and/or a material composition of the fin-shaped structure 10F, and the base layer 10A may be directly connected with the mesa structure 10P and the fin-shaped structure 10F. For example, the base layer 10A, the mesa structure 10P, and the fin-shaped structure 10F may include the same semiconductor material (such as silicon), and the mesa structure 10P and/or the fin-shaped structure 10F may be doped with required dopants by implantation processes according to some design considerations (such as adjusting the electrical properties of the corresponding semiconductor devices), but not limited thereto. In other words, the mesa structure 10P and the fin-shaped structure 10F may be structures formed by performing a patterning process to the semiconductor substrate 10, and the conductivity type and/or the doping condition of the mesa structure 10P may be identical to or different from those of the fin-shaped structure 10F according to some design considerations.

In some embodiments, the vertical direction D1 described above may be regarded as a thickness direction of the semiconductor substrate 10 and/or a thickness direction of the base layer 10A. The base layer 10A may have the top surface TS and a bottom surface BS opposite to the top surface TS in the vertical direction D1, and the isolation structure IS and the first electrically conductive structure CS1 described above may be disposed at the side of the top surface TS of the base layer 10A. Horizontal directions substantially orthogonal to the vertical direction D1 (such as a horizontal direction D2 and other directions orthogonal to the vertical direction D1) may be substantially parallel with the top surface TS and/or the bottom surface BS of the base layer 10A, but not limited thereto. In this description, a distance between the bottom surface BS of the base layer 10A and a relatively higher location and/or a relatively higher part in the vertical direction D1 may be greater than a distance between the bottom surface BS of the base layer 10A and a relatively lower location and/or a relatively lower part in the vertical direction D1. The bottom or a lower portion of each component may be closer to the bottom surface BS of the base layer 10A in the vertical direction D1 than the top or upper portion of this component. Another component disposed above a specific component may be regarded as being relatively far from the bottom surface BS of the base layer 10A in the vertical direction D1, and another component disposed under a specific component may be regarded as being relatively close to the bottom surface BS of the base layer 10A in the vertical direction D1. It is worth noting that, in this description, a top surface of a specific component may include the topmost surface of this component in the vertical direction D1, and a bottom surface of a specific component may include the bottommost surface of this component in the vertical direction D1, but not limited thereto. Additionally, in this description, the condition that a certain component is disposed between two other components in a specific direction may include a condition that the certain component is sandwiched between the two other components in the specific direction, but not limited thereto.

In some embodiments, each of the fin-shaped structures 10F may extend in another horizontal direction different from the horizontal direction D2 (such as another horizontal direction orthogonal to the horizontal direction D2, but not limited thereto), and a length of each of the fin-shaped structures 10F in the horizontal direction D2 may be regarded as a width of each of the fin-shaped structures 10F, and a width of the mesa structure 10P (such as a length of the mesa structure 10P in the horizontal direction D2) may be obviously greater than the width of each of the fin-shaped structures 10F, but not limited thereto. In addition, the semiconductor substrate 10 may further include a fin-shaped structure 10C protruding upwards in the vertical direction D1 from the top surface TS of the base layer 10A located in the fin device region R2, and the height of the fin-shaped structure 10C in the vertical direction D1 may be less than the height of each of the fin-shaped structures 10F in the vertical direction D1. The fin-shaped structure 10C may be completely covered by the isolation structure IS, and the fin-shaped structure 10C may be regarded as a remaining structure of the fin-shaped structure 10F on the base layer 10A after a fin remove process or a fin cut process is performed to this fin-shaped structure 10F, but not limited thereto.

In some embodiments, the isolation structure IS may include a single layer or multiple layers of insulation materials, such as silicon oxide, silicon nitride, or other suitable insulation materials. For example, the isolation structure IS may include an insulation layer 24, an insulation layer 26, and an insulation layer 28 disposed in a stacked configuration, the insulation layer 24 may include an oxide insulation material formed by in-situ steam generation (ISSG) technology, the insulation layer 26 may include an oxide insulation material formed by an atomic layer deposition (ALD) process, and the insulation layer 28 may include an oxide insulation material formed by a spin coating approach, but not limited thereto. In some embodiments, a top surface of the first portion P1 of the isolation structure IS (such as a top surface TS6) may be higher than a top surface TS8 of the second portion P2 of the isolation structure IS in the vertical direction D1, and the top surface TS6 of the first portion P1 of the isolation structure IS may be higher than or coplanar with a top surface TS1 of the mesa structure 10P in the vertical direction D1. In addition, the top surface TS8 of the second portion P2 of the isolation structure IS may be lower than a top surface TS2 of each of the fin-shaped structures 10F in the vertical direction D1, the top portion of each of the fin-shaped structures 10F is not covered by the isolation structure IS, and the top surface TS2 of each of the fin-shaped structures 10F and the top surface TS1 of the mesa structure 10P may be substantially coplanar, but not limited thereto. In some embodiments, the first portion P1 of the isolation structure IS may include a first section SS1 and a second section SS2. The second section SS2 may be directly connected with the first section SS1, the first section SS1 may be located between the sidewall SW of the mesa structure 10P and the second section SS2 in a horizontal direction (such as the horizontal direction D2, but not limited thereto), and the first section SS1 may directly contact the sidewall SW of the mesa structure 10P. In addition, the top surface TS6 of the first section SS1 may be higher than a top surface TS7 of the second section SS2 in the vertical direction D1, and the top surface TS6 of the first section SS1 may be higher than or coplanar with the top surface TS1 of the mesa structure 10P in the vertical direction D1

In some embodiments, the sidewall SW of the mesa structure 10P may be completely covered by the isolation structure IS (such as the insulation layer 24 in the first portion P1) in the horizontal direction. Therefore, a sidewall SW of a topmost portion of the mesa structure 10P in the vertical direction D1 may be covered by the first portion P1 of the isolation structure IS in the horizontal direction, and the first portion P1 of the isolation structure IS (such as the insulation layer 24) may directly contact the sidewall SW of the topmost portion of the mesa structure 10P. The first electrically conductive structure CS1 may be partly disposed on the mesa structure 10P and partly disposed on the first portion P1 of the isolation structure IS (such as the first section SS1), and a bottom surface BS3 of the first electrically conductive structure CS1 disposed on the isolation structure IS may be higher than the top surface TS1 of the mesa structure 10P in the vertical direction D1. In some embodiments, the semiconductor device 101 may further include a dielectric layer DL1 disposed on the planar device region R1, and the dielectric layer DL1 may be partly disposed on the mesa structure 10P in the vertical direction D1 and partly disposed on the first portion P1 of the isolation structure IS (such as the first section SS1) in the vertical direction D1. The dielectric layer DL1 disposed on the mesa structure 10P may be sandwiched between the first electrically conductive structure CS1 and the mesa structure 10P in the vertical direction D1, the dielectric layer DL1 disposed on the first portion P1 of the isolation structure IS may be at least partially sandwiched between the first electrically conductive structure CS1 and the first portion P1 of the isolation structure IS in the vertical direction D1, and the dielectric layer DL1 and the first electrically conductive structure CS1 may constitute a first gate structure GS1, but not limited thereto. In some embodiments, the first electrically conductive structure CS1, the mesa structure 10P, and the dielectric material sandwiched between the first electrically conductive structure CS1 and the mesa structure 10P (such as the dielectric layer DL1, but not limited thereto) may be at least a portion of a planar metal-oxide-semiconductor capacitor (MOSCAP) device, the first electrically conductive structure CS1 may be regarded as an electrode (such as a top electrode) in this capacitor device, the first electrically conductive structure CS1 may extend to be disposed on the isolation structure IS because the first portion P1 of the isolation structure IS covers the sidewall SW of the mesa structure 10P, the area where the first electrically conductive structure CS1 overlaps the mesa structure 10P in the vertical direction D1 may be increased accordingly, and the first electrically conductive structure CS1 and/or the first gate structure GS1 may be kept from covering the sidewall SW of the mesa structure 10P and influencing the electrical properties of the planar capacitor device (such as capacitance stability, but not limited thereto), but not limited thereto. In some embodiments, the first electrically conductive structure CS1 and the mesa structure 10P may be used to form other suitable planar devices also.

In some embodiments, the semiconductor device 101 may further include a second electrically conductive structure CS2 and a dielectric layer DL2. The second electrically conductive structure CS2 and the dielectric layer DL2 are disposed on the fin device region R2, and the second electrically conductive structure CS2 is disposed on the dielectric layer DL2. The second electrically conductive structure CS2 and the dielectric layer DL2 are disposed on the second portion P2 of the isolation structure IS and disposed straddling the fin-shaped structures 10F. Therefore, the dielectric layer DL2 may be partly sandwiched between the second electrically conductive structure CS2 and the isolation structure IS and partly sandwiched between the second electrically conductive structure CS2 and the fin-shaped structure 10F. In some embodiments, the dielectric layer DL2 and the second electrically conductive structure CS2 may constitute a second gate structure GS2, and the second electrically conductive structure CS2, the fin-shaped structure 10F and the dielectric material sandwiched between the second electrically conductive structure CS2 and the fin-shaped structure 10F (such as the dielectric layer DL2, but not limited thereto) may form at least a portion of a fin type semiconductor device (such as a transistor, a capacitor, or other suitable semiconductor devices), but not limited thereto. In some embodiments, the first electrically conductive structure CS1 and the second electrically conductive structure CS2 may respectively include a non-metallic electrically conductive material (such as doped polysilicon) or a metallic electrically conductive material, such a metal gate structure composed of a work function layer and a low electrical resistivity layer disposed in a stacked configuration, and a material composition of the first electrically conductive structure CS1 may be identical to or different from a material composition of the second electrically conductive structure CS2 according to some design considerations. The low electrical resistivity layer described above may include tungsten, aluminum, copper, titanium aluminide, titanium, or other suitable low electrical resistivity materials, and the work function layer described above may include titanium nitride (TIN), titanium carbide (TiC), tantalum nitride (TaN), tantalum carbide (TaC), tungsten carbide (WC), titanium tri-aluminide (TiAl$_3$), aluminum titanium nitride (TiAlN), or other suitable electrically conductive work function materials. The dielectric layer DL1 and the dielectric layer DL2 may respectively include gate oxide, high dielectric constant (high-k) dielectric materials, or other suitable dielectric materials, and a material composition of the dielectric layer DL1 may be identical to or different from a material composition of the dielectric layer DL2 according to some deign considerations.

In some embodiments, a bottom surface BS1 of the first gate structure GS1 disposed on the isolation structure IS may be higher than or substantially coplanar with the top surface TS1 of the mesa structure 10P in the vertical direction D1, and the bottom surface BS1 of the first gate structure GS1 disposed on the isolation structure IS may be higher than a bottom surface BS2 of the second gate structure GS2 disposed on the isolation structure IS and a bottom surface BS4 of the second electrically conductive structure CS2 in the vertical direction D1. Additionally, in some embodiments, the semiconductor device 101 may further include an interfacial layer 32A, an interfacial layer 32B, a spacer 34A, a spacer 34B, and a dielectric layer 36. The interfacial layer 32A may be disposed on the mesa structure 10P and sandwiched between the mesa structure 10P and the dielectric layer DL1 in the vertical direction D1, and the interfacial layer 32B may be disposed on the fin-shaped structures 10F without being covered by the isolation structure IS and sandwiched between the fin-shaped structure 10F and the dielectric layer DL2. In some embodiments, the interfacial layer 32A and the interfacial layer 32B may respectively include an oxide dielectric material (such as an oxide material formed by in-situ steam generation technology) or other suitable dielectric materials, and a material composition of the interfacial layer 32A may be identical to or different from a material composition of the interfacial layer 32B according to some design considerations. The spacer 34A may be disposed on the planar device region R1, the spacer 34A may be disposed on the second section SS2 of the first portion P1 of the isolation structure IS in the vertical direction D1, and the spacer 34A may be disposed on a sidewall of the first gate structure GS1 and a sidewall of the first section SS1 of the first portion P1 of the isolation structure IS in the horizontal direction. The spacer 34B may be disposed on the fin device region R2, the spacer 34B may be disposed on the isolation structure IS in the vertical direction D1, and the spacer 34B may be disposed on a sidewall of the second gate structure GS2 in the horizontal direction. In some embodiments, the spacer 34A and the spacer 34B may respectively include a single layer or multiple layers of dielectric materials, such as silicon oxide, silicon nitride, silicon oxynitride, or other suitable dielectric materials, and a material composition of the spacer 34A may be identical to or different from a material composition of the spacer 34B according to some design considerations. The dielectric layer 36 may be disposed on the planar device region R1 and the fin device region R2, the dielectric layer 36 disposed on the planar device region R1 may surround the spacer 34A and the first gate structure GS1 in the horizontal directions, and the dielectric layer 36 disposed on the fin device region R2 may surround the spacer 34B and the second gate structure GS2 in the horizontal directions. In some embodiments, the dielectric layer 36 may include a single layer or multiple layers of dielectric materials. For example, the dielectric layer 36 may include an etching stop layer and a dielectric material disposed on the etching stop layer, and a material composition of the dielectric material may be different from a material composition of the etching stop layer, but not limited thereto.

Figure 2:
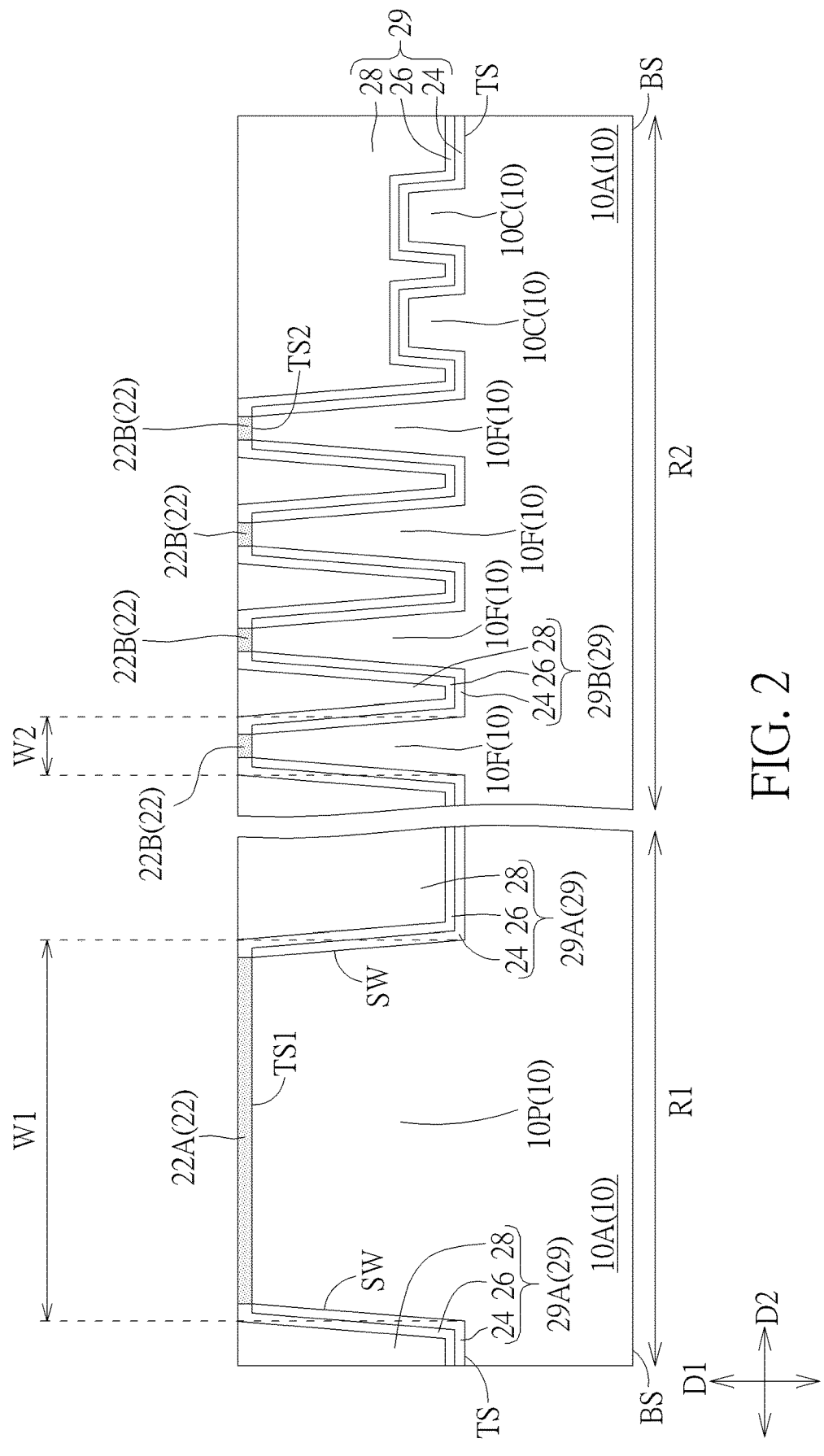
Figure 3:
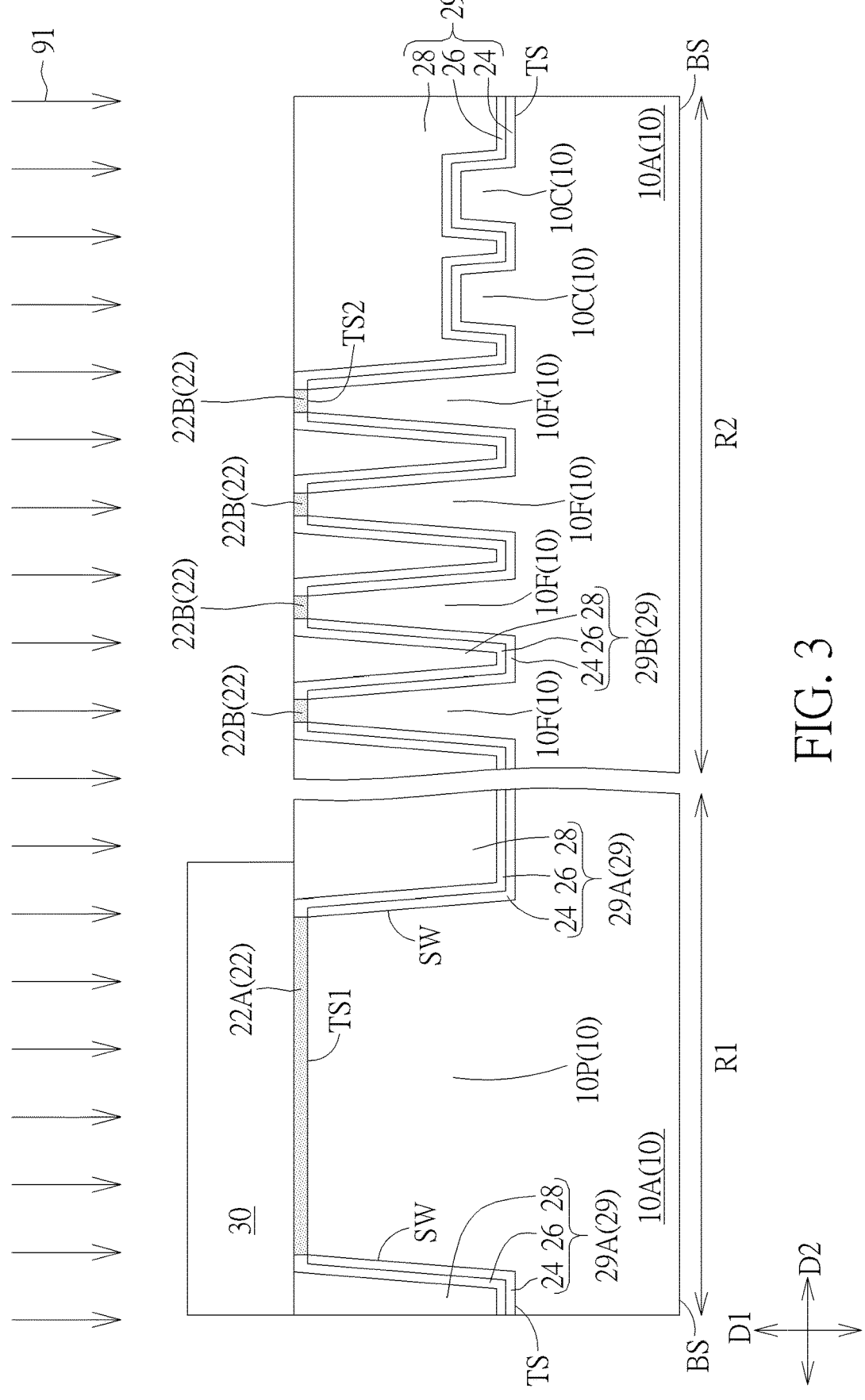
Figure 4:
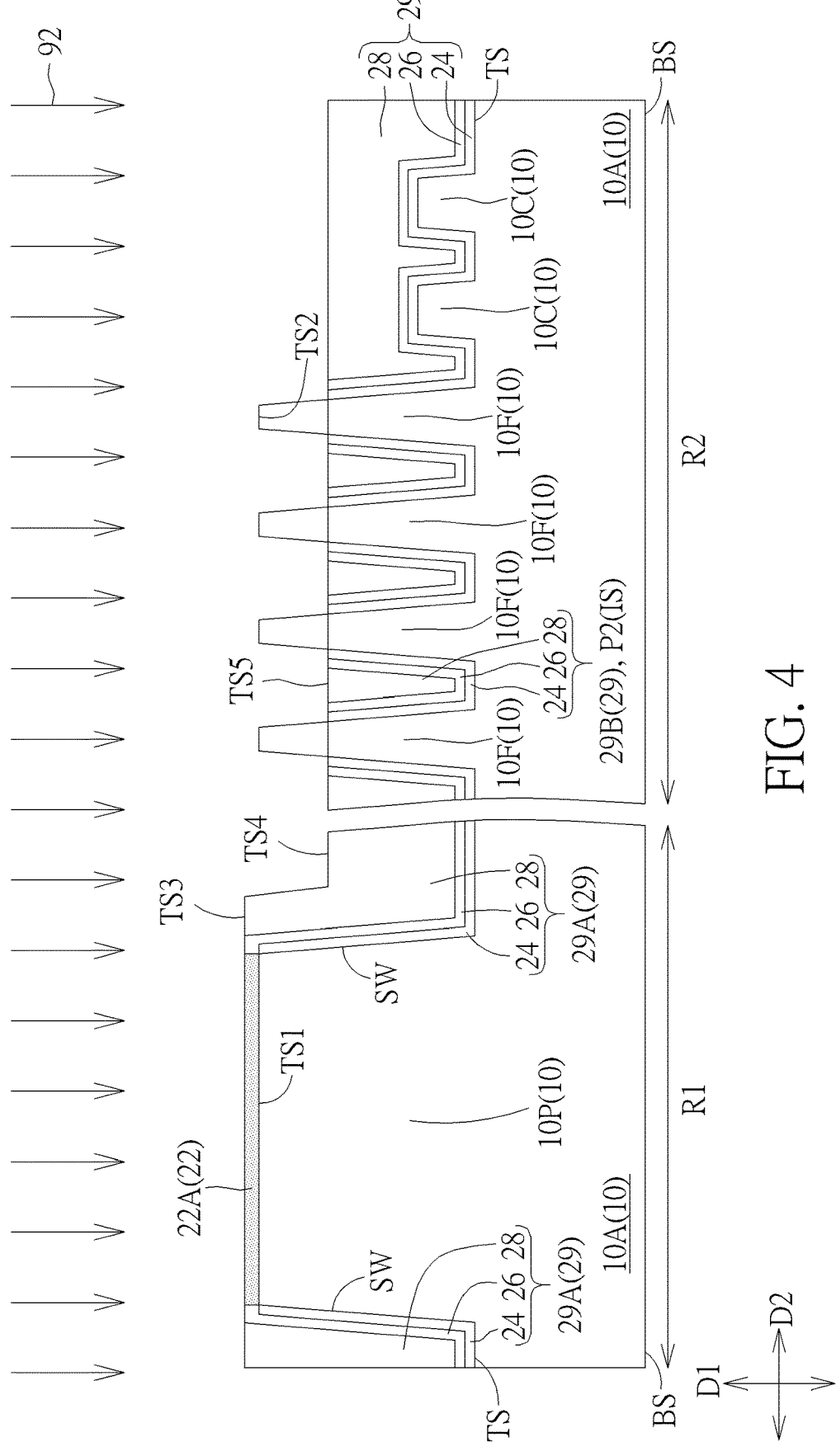
Figure 5:
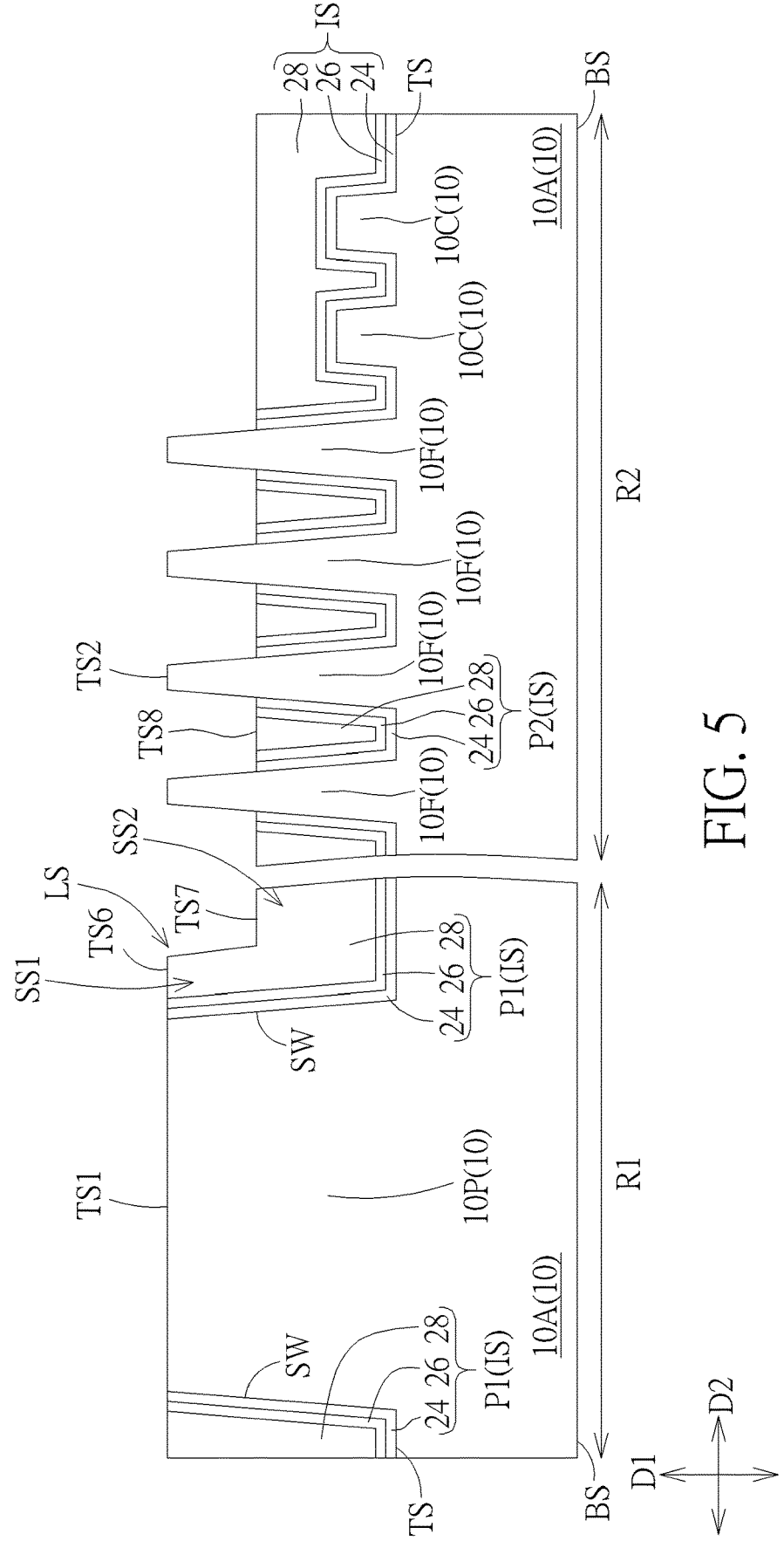
Figure 6:
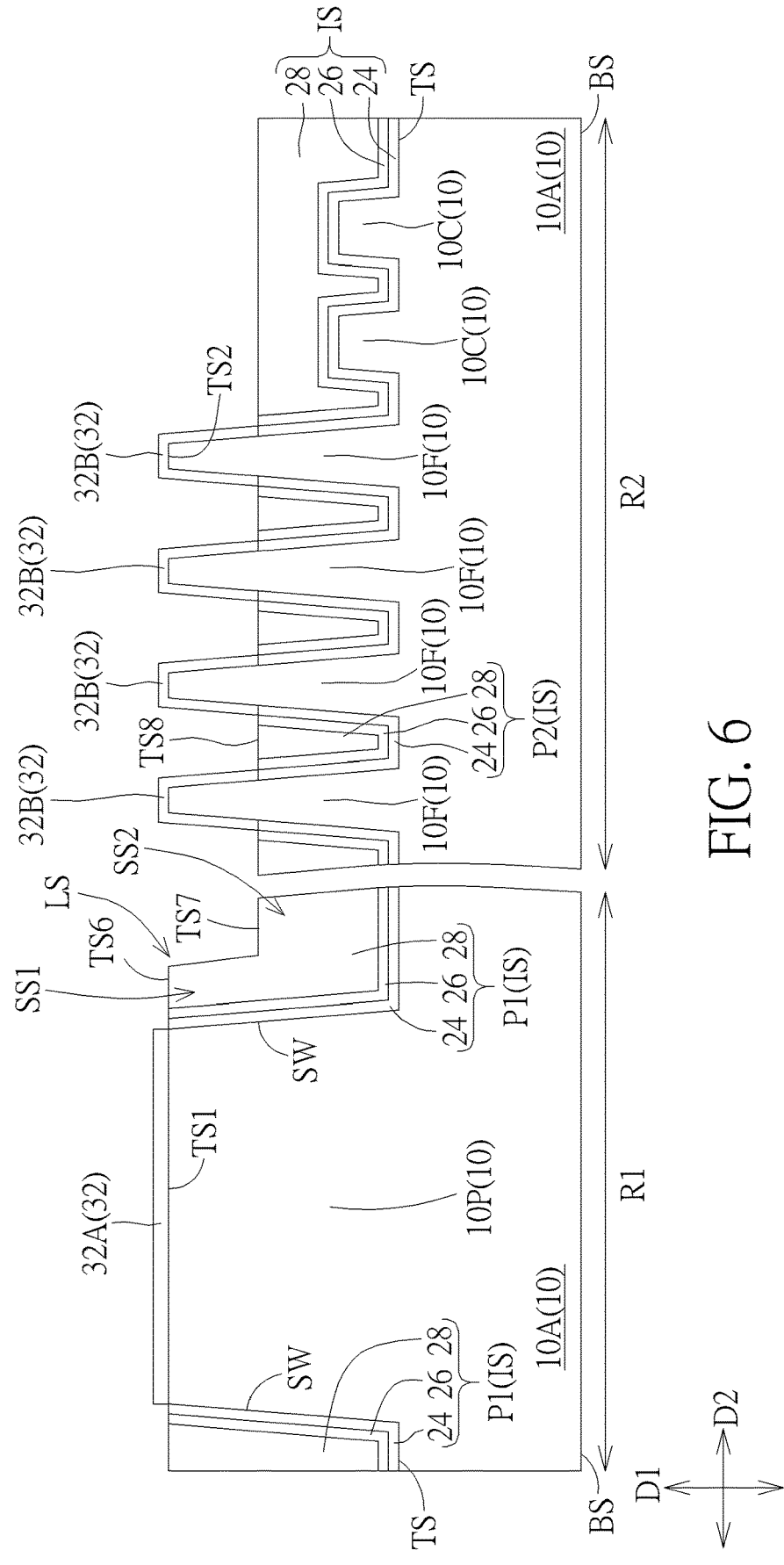

Please refer to FIG. 1 and FIGS. 2-6. FIGS. 2-6 are schematic drawings illustrating a manufacturing method of a semiconductor device according to an embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, and FIG. 6 is a schematic drawing in a step subsequent to FIG. 5. In some embodiments, FIG. 1 may be regarded as a schematic drawing in a step subsequent to FIG. 6, but not limited thereto. As shown in FIG. 1, the manufacturing method of the semiconductor device in this embodiment may include the following steps. The semiconductor substrate 10 is provided. The semiconductor substrate 10 has the planar device region R1 and the fin device region R2, and the semiconductor substrate 10 includes the mesa structure 10P and the fin-shaped structures 10F. The mesa structure 10P is disposed in the planar device region R1, and the fin-shaped structures 10F are disposed in the fin device region R2. The isolation structure IS is formed on the semiconductor substrate 10, and the isolation structure IS includes the first portion P1 and the second portion P2. The first portion P1 is disposed on the planar device region R1 and covers the sidewall SW of the mesa structure 10P, and the second portion P2 is disposed on the fin device region R2 and located between the fin-shaped structures 10F. Subsequently, the first electrically conductive structure CS1 is formed on the planar device region R1. The first electrically conductive structure CS1 is partly disposed above the mesa structure 10P in the vertical direction D1 and partly disposed above the first portion P1 of the isolation structure IS in the vertical direction D1.

Specifically, the manufacturing method in the present invention may include but is not limited to the following steps. As shown in FIG. 2, the mesa structure 10P and the fin-shaped structures 10F described above may be formed by performing a patterning process to the semiconductor substrate 10, and the fin-shaped structure 10C may be regarded as a structure remaining on the base layer 10A after a fin remove process or a fin cut process is performed to some of the fin-shaped structures 10F, but not limited thereto. Each of the fin-shaped structures 10F may be elongated in a horizontal direction different from the horizontal direction D2, the length of each of the fin-shaped structures 10F in the horizontal direction D2 may be regarded as a width W2 of each of the fin-shaped structures 10F, and a width W1 of the mesa structure 10P (such as the length of the mesa structure 10P in the horizontal direction D2) may be obviously greater than the width W2 of each of the fin-shaped structures 10F. In some embodiments, a mask layer 22 may be formed on the semiconductor substrate 10 before the patterning process described above, and the mask layer 22 may include a first portion 22A located on the mesa structure 10P and a second portion 22B located on the fin-shaped structures 10F after the patterning process. After the steps of forming the mesa structure 10P, the fin-shaped structures 10F, and the fin-shaped structures 10C, an insulation material 29 may be formed on the semiconductor substrate 10. A first portion 29A of the insulation material 29 may be formed on the planar device region R1 and cover the sidewall SW of the mesa structure 10P, and a second portion 29B of the insulation material 29 may be formed on the fin device region R2 and located between the fin-shaped structures 10F. The insulation material 29 may include a single layer or multiple layers of insulation materials, such as the insulation layer 24, the insulation layer 26, and the insulation layer 28 described above and disposed in a stacked configuration, but not limited thereto. In some embodiments, a planarization process may be performed to the insulation material 29, and a top surface of the insulation material 29 and a top surface of the mask layer 22 may be substantially coplanar accordingly, but not limited thereto.

As shown in FIGS. 2-4, an etching process 91 may be performed to the insulation material 29 for removing a part of the second portion 29B of the insulation material 29 and the second portion 22B of the mask layer 22 and exposing the top portion of each of the fin-shaped structures 10F. Therefore, a top surface TS5 of the second portion 29B of the insulation material 29 may be lower than the top surface TS2 of each of the fin-shaped structures 10F in the vertical direction D1 after the etching process 91. In some embodiments, the second portion 29B of the insulation material 29 may be partially removed by the etching process 91 to become the second portion P2 of the isolation structure IS described above. In some embodiments, a mask layer 30 may be formed on the planar device region R1 before the etching process 91, the mask layer 30 may cover the mesa structure 10P and the first portion 22A of the mask layer 22 in the vertical direction D1, and the mask layer 30 may cover at least a part of the first portion 29A of the insulation material 29 in the vertical direction D1. The mask layer 30 may be used as an etching mask in the etching process 91, and the mask layer 30 may include photoresist or other suitable mask materials. Therefore, in the etching process 91, the mask layer 30 may cover the mesa structure 10P and at least a part of the first portion 29A of the insulation material 29, and a part of the first portion 29A of the insulation material 29 (such as a part of the first portion 29A of the insulation material 29 without being covered by the mask layer 30 in the vertical direction D1) may be removed by the etching process 91. Accordingly, after the etching process 91, a top surface TS3 of a part of the first portion 29A of the insulation material 29 directly connected with the mesa structure 10P may be higher than a top surface TS4 of a part of the first portion 29A of the insulation material 29 relatively far from the mesa structure 10P in the vertical direction D1, and the sidewall SW of the topmost portion of the mesa structure 10P may be covered by the first portion 29A of the insulation material 29 in the etching process 91 and after the etching process 91.

As shown in FIGS. 3-5, a removing process 92 may be performed after the etching process 91, and the mask layer 30 may be removed before the removing process 92. The first portion 29A of the insulation material 29 may be partially removed by the etching process 91 and the removing process 92 to become the first portion P1 of the isolation structure IS described above, and the top surface TS5 of the second portion P2 of the isolation structure IS may be influenced by the removing process 92 and slightly lowered to become the top surface TS8 described above. Therefore, the first portion P1 of the isolation structure IS may include the first section SS1 and the second section SS2 described above, and the surface step height between the first section SS1 and the second section SS2 may be regarded as a ladder structure LS, but not limited thereto. In addition, the first portion 22A of the mask layer 22 may be removed by the removing process 92 for exposing the top surface TS1 of the mesa structure 10P. In some embodiments, the removing process 92 may include an etching process, a cleaning process, or other suitable removing approaches, such as a removing approach with low damage to the mesa structure 10P and the fin-shaped structure 10F and/or with low etching rate to the mesa structure 10P and the fin-shaped structure 10F for reducing the destruction to the mesa structure 10P and the fin-shaped structure 10F. For example, an isotropic wet etching or a wet cleaning process with higher selectivity may be used to remove the first portion 22A of the mask layer 22, but not limited thereto. Additionally, after the removing process 92, the sidewall SW of the topmost portion of the mesa structure 10P may be still covered by the first section SS1 of the first portion P1 of the isolation structure IS for keeping the electrically conductive structure subsequently formed from covering the sidewall of the mesa structure 10P. It is worth noting that in the present invention, the method of forming the isolation structure IS may include but is not limited to the steps illustrated in FIGS. 2-5 described above, and the isolation structure IS illustrated in FIG. 5 may also be formed by other suitable approaches according to some design considerations.

As shown in FIG. 6, after the step of forming the isolation structure IS, the interfacial layer 32A and the interfacial layer 32B described above may be formed. In some embodiments, the interfacial layer 32A and the interfacial layer 32B may be formed by an in-situ steam generation technology, the interfacial layer 32A may be formed on the exposed top surface TS1 of the mesa structure 10P and the interfacial layer 32B may be formed on the exposes surface of the fin-shaped structures 10F accordingly, and the material composition of the interfacial layer 32A may be substantially the same as the material composition of the interfacial layer 32B (such as a dielectric material 32), but not limited thereto. Subsequently, as shown in FIG. 1, the spacer 34A, the spacer 34B, the dielectric layer 36, the dielectric layer DL1, the dielectric layer DL2, the first electrically conductive structure CS1, and the second electrically conductive structure CS2 described above may be formed. The first electrically conductive structure CS1 and the dielectric layer DL1 may be formed on the planar device region R1, and the first electrically conductive structure CS1 and the dielectric layer DL1 may be partly located on the interfacial layer 32A and partly located on the first portion P1 of the isolation structure IS. The second electrically conductive structure CS2 and the dielectric layer DL2 may be formed on the fin device region R2, and the second electrically conductive structure CS2 and the dielectric layer DL2 may be located on the second portion P2 of the isolation structure IS and disposed straddling the fin-shaped structures 10F. In some embodiments, the first gate structure GS1 and the second gate structure GS2 may be formed by a replacement metal gate (RMG) process, the spacer 34A, the spacer 34B, and the dielectric layer 36 may be formed before the step of forming the first gate structure GS1 and the second gate structure GS2 accordingly, and the top surface of the dielectric layer 36, the top surface of the first gate structure GS1, and the top surface of the second gate structure GS2 may be substantially coplanar, but not limited thereto.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 7:
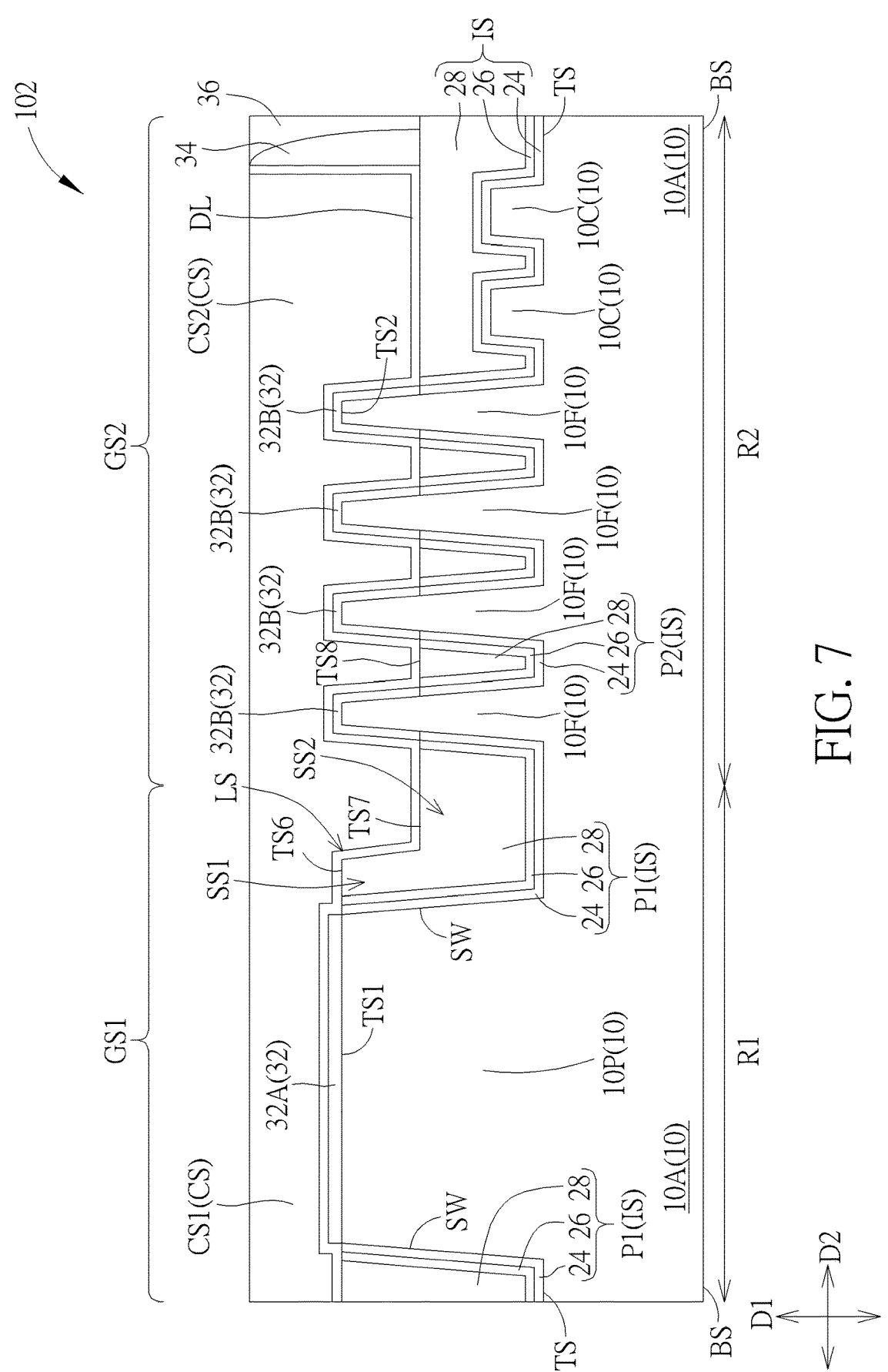
FIG. 7 is a schematic drawing illustrating a semiconductor device according to a second embodiment of the present invention.

Please refer to FIG. 7. FIG. 7 is a schematic drawing illustrating a semiconductor device 102 according to a second embodiment of the present invention. As shown in FIG. 7, in the semiconductor device 102, the first electrically conductive structure CS1 and the second electrically conductive structure CS2 may be directly connected with each other. For example, a dielectric layer DL and an electrically conductive structure CS may be formed on the planar device region R1 and the fin device region R2. The dielectric layer DL formed on the planar device region R1 may be located on the mesa structure 10P, the interfacial layer 32A, and the first portion P1 of the isolation structure IS, the dielectric layer DL formed on the fin device region R2 may be located on the fin-shaped structures 10F, the interfacial layer 32B, and the second portion P2 of the isolation structure IS, and the electrically conductive structure CS may be formed on the dielectric layer DL. The electrically conductive structure CS may include a non-metallic electrically conductive material (such as doped polysilicon) or a metallic electrically conductive material, such a metal gate structure composed of a work function layer and a low electrical resistivity layer disposed in a stacked configuration, and the dielectric layer DL may include gate oxide, high dielectric constant (high-k) dielectric materials, or other suitable dielectric materials. The electrically conductive structure CS disposed on the planar device region R1 may be regarded as the first electrically conductive structure CS1 described above, the electrically conductive structure CS disposed on the fin device region R2 may be regarded as the second electrically conductive structure CS2 described above, the first electrically conductive structure CS1 and the dielectric layer DL disposed on the planar device region R1 may constitute the first gate structure GS1 described above, and the second electrically conductive structure CS2 and the dielectric layer DL disposed on the fin device region R2 may constitute the second gate structure GS2 described above. In other words, the first electrically conductive structure CS1 and the second electrically conductive structure CS2 may be formed concurrently by the same process and connected with each other, and the material composition of the first electrically conductive structure CS may be identical to the material composition of the second electrically conductive structure CS2.

Figure 8:
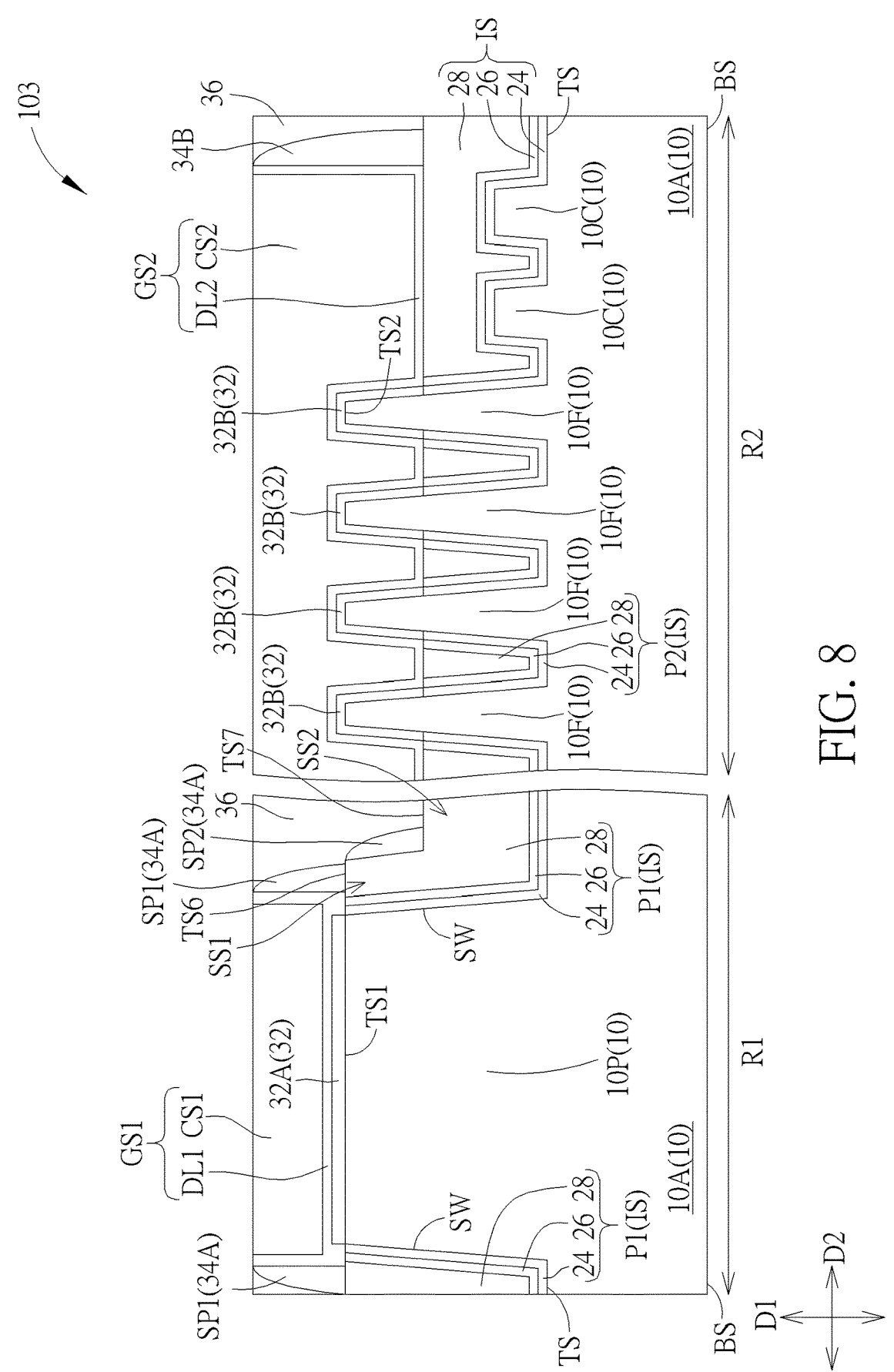
FIG. 8 is a schematic drawing illustrating a semiconductor device according to a third embodiment of the present invention.

Please refer to FIG. 8. FIG. 8 is a schematic drawing illustrating a semiconductor device 103 according to a third embodiment of the present invention. As shown in FIG. 8, in the semiconductor device 103, the spacer 34A may be partly formed on the top surface TS6 of the first section SS1 of the first portion P1 of the isolation structure IS and partly formed on the top surface TS7 of the second section SS2 of the first portion P1 of the isolation structure IS. For example, a first portion SP1 of the spacer 34A may be located on the top surface TS6 of the first section SS1 in the vertical direction D1 and cover the sidewall of the first gate structure GS1 in the horizontal direction, and a second portion SP2 of the spacer 34A may be located on the top surface TS7 of the second section SS2 in the vertical direction D1 and cover a sidewall of the first section SS1. In some embodiments, the material composition of the first portion SP1 and the second portion SP2 of the spacer 34A may be identical to the material composition of the spacer 34B, and the first portion SP1 and the second portion SP2 of the spacer 34A may be separated from each other without being directly connected with each other, but not limited thereto.

Figure 9:
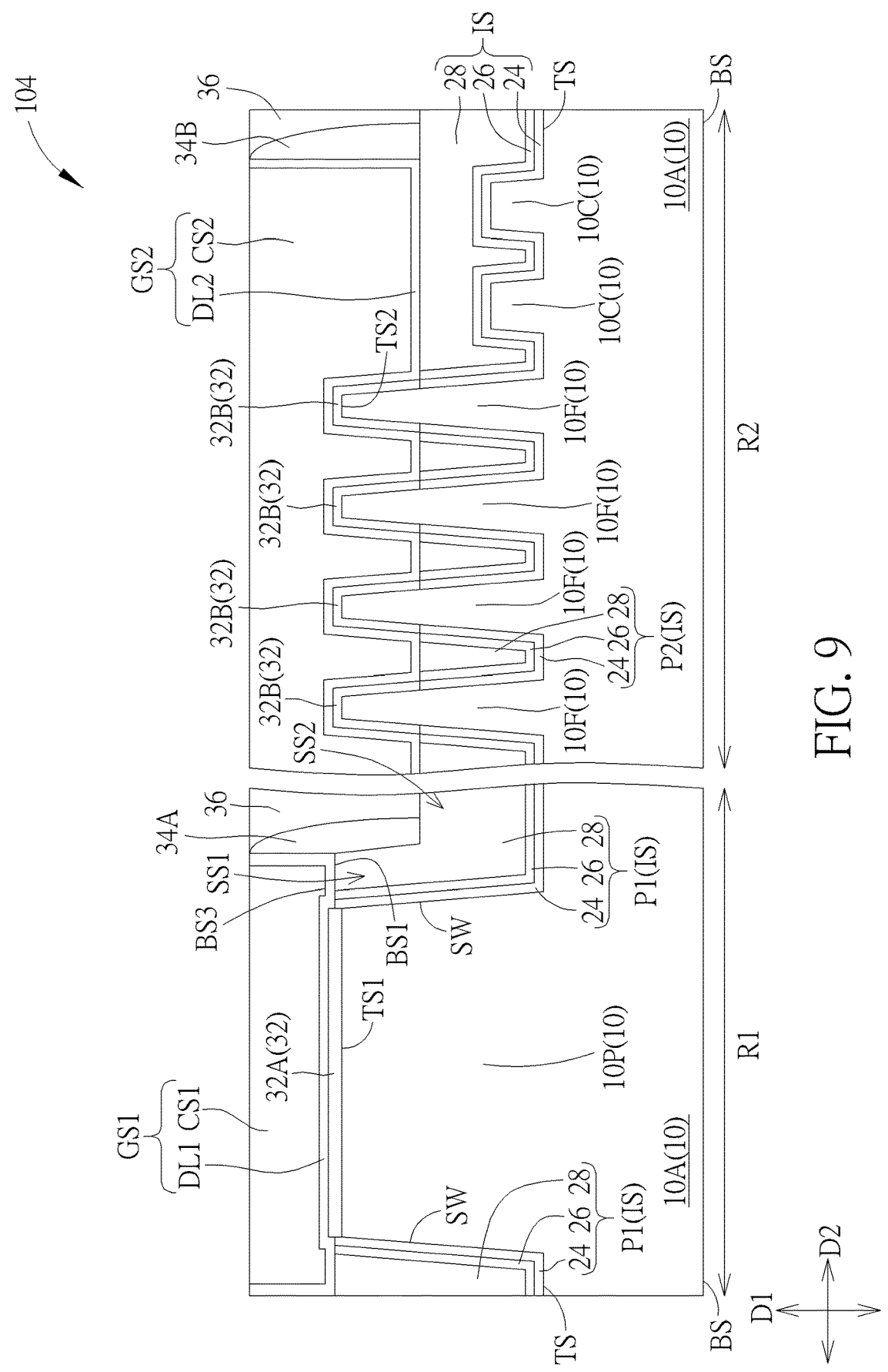
FIG. 9 is a schematic drawing illustrating a semiconductor device according to a fourth embodiment of the present invention.

Please refer to FIG. 9. FIG. 9 is a schematic drawing illustrating a semiconductor device 104 according to a fourth embodiment of the present invention. As shown in FIG. 9, in the semiconductor device 104, the top surface of the first portion P1 of the isolation structure IS (such as the top surface TS6 of the first section SS1) may be higher than the top surface TS1 of the mesa structure 10P in the vertical direction D1, and the first portion P1 of the isolation structure IS (such as the first section SS1) may completely cover the sidewall SW of the mesa structure 10P in the horizontal direction and partially cover a sidewall of the of the interfacial layer 32A in the horizontal direction accordingly, but not limited thereto. Therefore, the bottom surface BS1 of the first gate structure GS1 formed above the first portion P1 of the isolation structure IS and the bottom surface BS3 of the first electrically conductive structure CS1 formed above the first portion P1 of the isolation structure IS may be higher than the top surface TS1 of the mesa structure 10P in the vertical direction D1.

To summarize the above descriptions, in the semiconductor device and the manufacturing method according to the present invention, because the first portion of the isolation structure covers the sidewall of the mesa structure, the first electrically conductive structure may extend to be disposed above the first portion of the isolation structure for Increasing the area where the first electrically conductive structure overlaps the mesa structure and keeping the first electrically conductive structure from covering the sidewall of the mesa structure and influencing the electrical performance of the planar capacitor device. For example, when the planar device is a planar metal-oxide-semiconductor capacitor device, the capacitance of the capacitor device may be increased and/or the capacitance stability of the capacitor device may be improved accordingly for meeting specifications of related products.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a semiconductor substrate having a planar device region and a fin device region, wherein the semiconductor substrate comprises:
a mesa structure disposed in the planar device region; and
fin-shaped structures disposed in the fin device region;
an isolation structure disposed on the semiconductor substrate, wherein the isolation structure comprises:
a first portion disposed on the planar device region and covering a sidewall of the mesa structure; and
a second portion disposed on the fin device region and located between the fin-shaped structures;
a first electrically conductive structure disposed on the planar device region, wherein the first electrically conductive structure is partly disposed above the mesa structure in a vertical direction and partly disposed above the first portion of the isolation structure in the vertical direction; and
a dielectric layer partly disposed on the mesa structure in the vertical direction and partly disposed on the first portion of the isolation structure in the vertical direction, wherein the dielectric layer disposed on the mesa structure is sandwiched between the first electrically conductive structure and the mesa structure, the first electrically conductive structure, the mesa structure, and the dielectric layer are at least a portion of a planar capacitor device, and the first electrically conductive structure is a top electrode in the planar capacitor device.

2. The semiconductor device according to claim 1, wherein the semiconductor substrate further comprises:
a base layer, wherein the mesa structure and each of the fin-shaped structures protrude upwards from a top surface of the base layer, and a width of the mesa structure is greater than a width of each of the fin-shaped structures.

3. The semiconductor device according to claim 1, wherein a top surface of the first portion of the isolation structure is higher than a top surface of the second portion of the isolation structure in the vertical direction.

4. The semiconductor device according to claim 1, wherein a top surface of the first portion of the isolation structure is higher than or coplanar with a top surface of the mesa structure in the vertical direction.

5. The semiconductor device according to claim 1, wherein the first portion of the isolation structure comprises:
a first section; and a second section connected with the first section, wherein the first section is located between the sidewall of the mesa structure and the second section, and a top surface of the first section is higher than a top surface of the second section in the vertical direction.

6. The semiconductor device according to claim 1, wherein a sidewall of a topmost portion of the mesa structure is covered by the first portion of the isolation structure.

7. The semiconductor device according to claim 1, wherein the first portion of the isolation structure directly contacts a sidewall of a topmost portion of the mesa structure.

8. The semiconductor device according to claim 1, wherein a bottom surface of the first electrically conductive structure disposed above the first portion of the isolation structure is higher than a top surface of the mesa structure in the vertical direction.

9. The semiconductor device according to claim 1, further comprising:

a second electrically conductive structure disposed on the fin device region, wherein the second electrically conductive structure is disposed on the second portion of the isolation structure and disposed straddling the fin-shaped structures.

10. The semiconductor device according to claim 9, wherein the first electrically conductive structure is connected with the second electrically conductive structure.

11. A manufacturing method of a semiconductor device, comprising:

providing a semiconductor substrate having a planar device region and a fin device region, wherein the semiconductor substrate comprises:

a mesa structure disposed in the planar device region; and fin-shaped structures disposed in the fin device region;

forming an isolation structure on the semiconductor substrate, wherein the isolation structure comprises:

a first portion disposed on the planar device region and covering a sidewall of the mesa structure; and a second portion disposed on the fin device region and located between the fin-shaped structures;

forming a dielectric layer partly on the mesa structure in the vertical direction and partly on the first portion of the isolation structure in the vertical direction; and forming a first electrically conductive structure on the planar device region, wherein the first electrically conductive structure is partly disposed above the mesa structure in a vertical direction and partly disposed above the first portion of the isolation structure in the vertical direction, and the dielectric layer formed on the mesa structure is sandwiched between the first electrically conductive structure and the mesa structure, wherein the first electrically conductive structure, the mesa structure, and the dielectric layer are at least a portion of a planar capacitor device, and the first electrically conductive structure is a top electrode in the planar capacitor device.

12. The manufacturing method of the semiconductor device according to claim 11, wherein a method of forming the isolation structure comprises:

forming an insulation material on the semiconductor substrate, wherein a first portion of the insulation material is formed on the planar device region and covers the sidewall of the mesa structure, and a second portion of the insulation material is formed on the fin device region and located between the fin-shaped structures; and performing an etching process to the insulation material for removing a part of the second portion of the insulation material and exposing a top portion of each of the fin-shaped structures, wherein a mask layer covers the mesa structure and at least a part of the first portion of the insulation material in the etching process, and a part of the first portion of the insulation material is removed by the etching process.

13. The manufacturing method of the semiconductor device according to claim 12, wherein a top surface of the second portion of the insulation material is lower than a top surface of each of the fin-shaped structures in the vertical direction after the etching process.

14. The manufacturing method of the semiconductor device according to claim 12, wherein a sidewall of a topmost portion of the mesa structure is covered by the first portion of the insulation material after the etching process.

15. The manufacturing method of the semiconductor device according to claim 12, wherein the second portion of the insulation material is partially removed by the etching process to become the second portion of the isolation structure.

16. The manufacturing method of the semiconductor device according to claim 15, wherein the method of forming the isolation structure further comprises:

performing a removing process after the etching process, wherein the mask layer is removed before the removing process, and the first portion of the insulation material is partially removed by the etching process and the removing process to become the first portion of the isolation structure.

17. The manufacturing method of the semiconductor device according to claim 16, wherein the first portion of the isolation structure comprises:

a first section; and a second section connected with the first section, wherein the first section is located between the sidewall of the mesa structure and the second section, and a top surface of the first section is higher than a top surface of the second section in the vertical direction.

18. The manufacturing method of the semiconductor device according to claim 17, wherein a sidewall of a topmost portion of the mesa structure is covered by the first section of the first portion of the isolation structure after the removing process.

19. The manufacturing method of the semiconductor device according to claim 11, further comprising:

forming a second electrically conductive structure on the fin device region, wherein the second electrically conductive structure is disposed on the second portion of the isolation structure and disposed straddling the fin-shaped structures.

20. The manufacturing method of the semiconductor device according to claim 19, wherein the first electrically conductive structure and the second electrically conductive structure are formed concurrently by the same process and connected with each other.

* * * * *